United States Patent [19]

Hoenig

[11] Patent Number: 4,749,946
[45] Date of Patent: * Jun. 7, 1988

[54] DEVICE FOR THE MULTI-CHANNEL MEASUREMENT OF WEAK VARIABLE MAGNETIC FIELDS WITH SQUIDS AND SUPERCONDUCTING GRADIOMETERS ARRANGED ON A COMMON SUBSTRATE

[75] Inventor: Eckhardt Hoenig, Erlangen, Fed. Rep. of Germany

[73] Assignee: Siemens Aktiengesellschaft, Berlin and Munich, Fed. Rep. of Germany

[*] Notice: The portion of the term of this patent subsequent to May 27, 2003 has been disclaimed.

[21] Appl. No.: 562,493

[22] Filed: Dec. 16, 1983

[30] Foreign Application Priority Data

Dec. 22, 1982 [DE] Fed. Rep. of Germany ....... 3247543

[51] Int. Cl.$^4$ .................... G01R 33/02; H03K 3/38
[52] U.S. Cl. ................................. 324/248; 307/306
[58] Field of Search ................... 324/248; 307/306; 357/5

[56] References Cited

U.S. PATENT DOCUMENTS

| | | | |
|---|---|---|---|
| 4,320,341 | 3/1982 | Lutes | 324/248 |
| 4,386,361 | 5/1983 | Simmonds | 307/306 |
| 4,518,868 | 5/1985 | Harada | 357/5 |
| 4,591,787 | 5/1986 | Hoenig | 324/248 |
| 4,613,817 | 9/1986 | Hoenig | 324/248 |

OTHER PUBLICATIONS

"Planar Coupling Scheme for Ultra Low Noise DC SQUIDs", by Jaycox and Ketchen (IEEE Transactions on Magnetics, vol. MAG-17, No. 1, Jan. 1981 at pp. 400 to 403).
"A Seven Channel SQUID Magnetometer for Brain Research", by Ehnholm et al., Physica, vol. 107B, 1981 at pp. 29 to 30.
"Ultra Low Noise Nb DC SQUIDs", by Voss et al., (IEEE Transactions on Magnetics, vol. MAG-17, No. 1, Jan. 1981, pp. 395 to 399).
"Biomagnetism", by Williamson and Kaufman (Journal of Magnetism and Magnetic Materials, vol. 22, 1981 at pp. 129 to 201).
"SQUIDS and their applications in the measurement of weak magnetic fields", by Swithenby (J. Phys. E: Sci. Instrum., vol. 13, 1980, at pp. 801 to 813).
"Advances in SQUID Magnetometers", by Clarke (IEEE Transactions on Electron Devices, vol. ED-27, No. 10, Oct. 1980, at pp. 1896 to 1908).
"Biomagnetism-Proceedings, Third International Workshop on Biomagnetism," Berlin 1980, Berlin, New York, 1981 at pp. 3 to 31).
SQUID Superconducting Quantum Interference Devices and their Applications, Berlin, New York, 1977, pp. 395 to 431.
Shirae et al., "A new multi-element rf SQUID system and its application to the magnetic vector gradiometer", Cryogenics, Dec. 1981, pp. 707 to 710.

Primary Examiner—Reinhard J. Eisenzopf
Assistant Examiner—Walter E. Snow
Attorney, Agent, or Firm—Lawrence C. Edelman

[57] ABSTRACT

An improved device for the multi-channel measurement of weak variable magnetic fields with fields strengths below $10^{-10}$T, having in each channel a superconducting quantum interference device (SQUID), a gradiometer consisting of superconducting coils and superconducting elements between the quantum interference device and the gradiometer, and a coupling transformer and connecting leads. In addition, the device includes electronic equipment for the evaluation, processing and presentation of the information obtained at the quantum interference elements. In order to use this measurement device to obtain spatial field distributions, particularly those of biomagnetic fields, during reasonable measuring times, with a substantial coherence among the field data, the invention provides for a rigid substrate on which direct-current quantum interference devices with associated planar-designed gradiometer coils and the superconducting connecting elements are arranged, and in which case the coils and the connecting elements are thin-film structures on at least one level.

16 Claims, 3 Drawing Sheets

DEVICE FOR THE MULTI-CHANNEL MEASUREMENT OF WEAK VARIABLE MAGNETIC FIELDS WITH SQUIDS AND SUPERCONDUCTING GRADIOMETERS ARRANGED ON A COMMON SUBSTRATE

BACKGROUND OF THE INVENTION

The invention relates to a device for the multi-channel measurement of weak variable magnetic fields having field strengths below $10^{-10}$T, and in particular below $10^{-12}$T. The device contains a superconducting quantum interference device in each channel, and a gradiometer consisting of superconducting coils and superconducting connecting elements between the quantum interference device and the gradiometer. There is also a coupling transformer and connecting lines, in addition to electronic equipment for the evaluation, processing and presentation of the information obtained at the quantum interference devices. The invention also relates to a method for manufacuturing this measurement device.

The use of superconducting quantum interference devices, which are generally referred to as "SQUIDs" (abbreviation for "Superconducting Quantum Interference Devices), for the measurement of very weak magnetic fields is generally known ("J. Phy. E:Sci. Instrum.", Vol. 13, 1980, Pages 801 to 813; "IEEE Transactions on Electron Devices", Vol. ED-27, No. 10, October 1980, Pages 1896 to 1908). The preferred field of application for these devices is medical engineering and in particular magnetocardiography and magnetoencephalography. The magnetic cardiac or brain waves that occur in these sectors have field strengths that are located in the range from 50 pT to 0.1 pT ("Biomagnetism-Proceedings, Third International Workshop on Biomagnetism, Berlin 1980", Berlin/New York 1981, Pages 3 to 31).

A device for the measurement of biomagnetic fields of this kind includes the following principal components:

1. A SQUID, acting as a current sensor;
2. A flux transformer, a coil arrangement acting as a field-to-current transducer for sensing the field;
3. Electronic devices for collecting and processing signals;
4. Screening for the geomagnetic field and external interference fields; and
5. A cryogenic system for the superconducting components.

Measuring devices of this type are known (S.H.E. Corporation, San Diego, USA/S.H.E. GmbH, D-5100 Aachen).

In corresponding measurement devices with a one-channel design, the magnetic field to be investigated is coupled inductively through a coil arrangement made of superconducting wire into a circuit consisting of a radio-frequency (RF) SQUID with one Josephson contact. Gradiometers of the first or higher orders are constructed by combining one sensor coil with one or more compensation coils. With gradiometers of this type, it is possible, with the right kind of manual adjustment, to suppress almost entirely the three components of a homogenous magnetic field in the vicinity of the coils and/or the portion of such field with homogenous gradient. Also, the biomagnetic near field, which is still strongly non-uniform in the vicinity of the gradiometer, can be selectively obtained. The RF SQUID is also inductively coupled with a tank circuit, whose high-frequency voltage is modulated in phase or amplitude by the input signal. Generally, the operating point of the RF SQUID is maintained by negative feedback through an additional compensation coil, and the compensation current is used as a signal to be evaluated electronically.

The RF SQUIDs used in these units have a characteristic noise signal (cf., for example, "SQUID Superconducting Quantum Interference Devices and Their Applications", Berlin/New York 1977, Pages 395 to 431). Therefore, to measure the above-mentioned extremely weak magnetic fields, it is necessary to compute an average value for the signal at the individual measuring points with the aid of a large number of individual measurements. To obtain a spatial field distribution, it is necessary to take measurements one after the other at various points within the area to be investigated. In a measurement procedure of this type the field data will not remain coherent over the requisite measuring time, and, in addition, measuring times that are unacceptable for clinical purposes will occur.

To overcome these problems a multi-channel measurement device has been used instead of the familiar one-channel device. In the multi-channel device each channel has an RF SQUID, a tunable superconducting gradiometer and connecting elements between the SQUID and the gradiometer, which includes a coupling transformer and leads. Substantial time is lost in the utilization of this device, however, because the individual channels must be tuned to each other. Typically the gradiometer and the SQUID with its coupling transformer, are each arranged on their own carrying substrate and are connected with one another via detachable leads. This kind of connection, however, does not have the possibility of providing a constant tuning of the respective flux transformer in advance. Instead, it is necessary prior to every measurement to adjust all the channels. This adjustment can be difficult and time consuming because all the channels interact with one another. In addition, mutual interference of the RF circuits is unavoidable in this arrangement. If the gradiometer is dispensed with, an RF screening can, however, be achieved (cf. for example, "Physica", Volume 197,B, 1981, Pages 29 and 30). But even if an RF decoupling can be provided in some other way, the above-mentioned tuning problem remains.

A measurement device with three RF SQUIDs and only one tank circuit on a common substrate is disclosed in the publication "Cryogenics", December 1981, Pages 707 to 710. However, there are technical problems with this device. All the signal channels are combined into one high-frequency channel which provides the possibility of mutual interference. Additionally, the individual SQUID elements must be tuned to one another with regard to their critical current. Finally, the maximum number of elements that can be controlled in practice is therefore believed to be about 10.

In addition to the RF SQUIDs, each with a Josephson contact, that have been described above, direct current (DC) SQUIDs which include two Josephson contacts are also known. These DC SQUIDs can be designed so that they have an extremely small noise signal ("IEEE Transactions on Magnetics", Vol. MAG-17, No. 1, January 1981, Pages 395 to 399). The use of a modularly constructed system with 5 SQUIDs of this type for the measurement of biomagnetic fields is suggested. However, even though this device eliminates the problem of mutual RF interference, the above-mentioned tuning problem still exists.

SUMMARY OF THE INVENTION

The object of the present invention is to use DC SQUIDs to improve the device suggested above for the multi-channel measurement of weak variable magnetic fields so that it can be used to obtain the spatial distribution of biomagnetic fields within reasonable measuring times, while ensuring a substantial coherence of the field data.

This object is accomplished, according to the invention, by providing a common rigid substrate for DC SQUIDs and the planar-designed gradiometer coils associated with them, as well as for the superconducting connecting elements, with the gradiometer coils and the connecting elements being arranged at one or more planes, as thin-film structures.

Using this design for the measurement device permits parallel or simultaneous registration of the field values from various locations with the aid of an array of superconducting gradiometer coils, which are connected with a corresponding array of DC SQUIDs to form a rigid system. This allows the measuring time to be advantageously reduced in accordance with the number of channels. In addition, only a single adjustment is necessary when thin-film structures are used.

In general, the invention features, in one aspect, a device for the multi-channel measurement of weak variable magnetic fields with field strengths below $10^{-10}$T, which contains in each channel a superconducting quantum interference device (SQUID), a gradiometer having superconducting coils and superconducting connecting elements between the quantum interference device and the gradiometer, for the coupling transformer and leads, and which, in addition, includes electronic equipment for the evaluation, processing and presentation of information obtained at the quantum interference devices, in which a common rigid substrate is provided for direct-current superconducting quantum interference devices, planar-designed gradiometer coils that are associated with them and superconducting connecting elements, wherein the gradiometer coils and the connecting elements are arranged as thin-film structures on one or more planes.

In preferred embodiments of the measurement device the direct-current superconducting quantum interference devices are deposited on a common carrier chip which is rigidly mounted to the carrying structure; the substrate includes a single carrying part for the gradiometer coils, and connecting elements and the carrier chip of the direct-current superconducting quantum interference devices; all of the gradiometer coils are deposited on a common face of the substrate next to one another; the substrate is composed of a plurality of parts; the substrate includes two carrying parts wherein each of the parts are equipped with a gradiometer of the first order; the substrate includes quartz on silicon parts; the gradiometer coils are arranged as an array of detecting coils and as an array of compensation coils on the common substrate; the detecting coils have a different number of windings and different surface areas as compared with the associated compensation coils; the detecting coils and the compensation coils are arranged on different parallel faces of the substrate; the direct-current superconducting quantum interference devices are mounted on a face of the substrate, wherein the face lies in a plane other than that of the faces on which the gradiometer coils are deposited; the connections between the gradiometer coils are located on parallel faces, and are formed by thin-film conductors running between edges of the faces; the connections between the gradiometer coils and the direct-current superconducting quantum interference devices are formed by thin-film conductors running between the edges of the faces carrying these parts; the connection of the superconducting conductor elements to the edges is formed by soldering joints with superconducting material in grooves; the edges that include the grooves are beveled; dimensions (diameter D) of the individual gradiometer coils are adjusted to the closest magnetic field source to be detected, and means are provided for combining signals of individual gradiometer coils into a common signal from a group of gradiometer coils, depending on the distance of the magnetic field source to be detected in each case; in order to combine signals of individual gradiometer coils the corresponding channels in an electronic sytem for evaualtion and processing of information obtained at the quantum interference devices, are interconnected; the carrying chip is fastened indirectly to the carrying structure by means of an intermediate carrier; and the intermediate carrier has slits in the area of the superconducting conductor terminals.

In general, the invention features, in another aspect, a method for the manufacture of a measurement device for the multi-channel measurement of weak variable magnetic fields with field strengths below $10^{-10}$T, which contains in each channel a superconducting quantum interference device (SQUID), a gradiometer having superconducting coils and superconducting connecting elements between the quantum interference device and the gradiometer, with a coupling transformer and leads, and which, in addition, includes electronic equipment for the evaluation, processing and presentation of information obtained at the quantum interference devices, in which a common substrate is provided for direct-current superconducting quantum interference devices, planar-designed gradiometer coils that are associated with them, and superconducting connecting elements, wherein said gradiometer coils and said connecting elements are arranged as thin-film structures on one or more planes, wherein the method includes the steps of depositing the gradiometer coils together with the leads that interconnect to one another and run to the direct-current quantum interference devices located on a carrier chip, on the substrate by planar-lithography techniques, forming the direct-current quantum interference devices on the carrier chip, and connecting the carrier chip with the direct-current quantum interference devices.

Other features and advantages of the invention will be apparent from the following detailed description and from the claims.

For a full understanding of the present invention, reference should now be made to the following detailed description of the invention and to the accompanying drawings.

DETAILED DESCRIPTION

Figure 1:
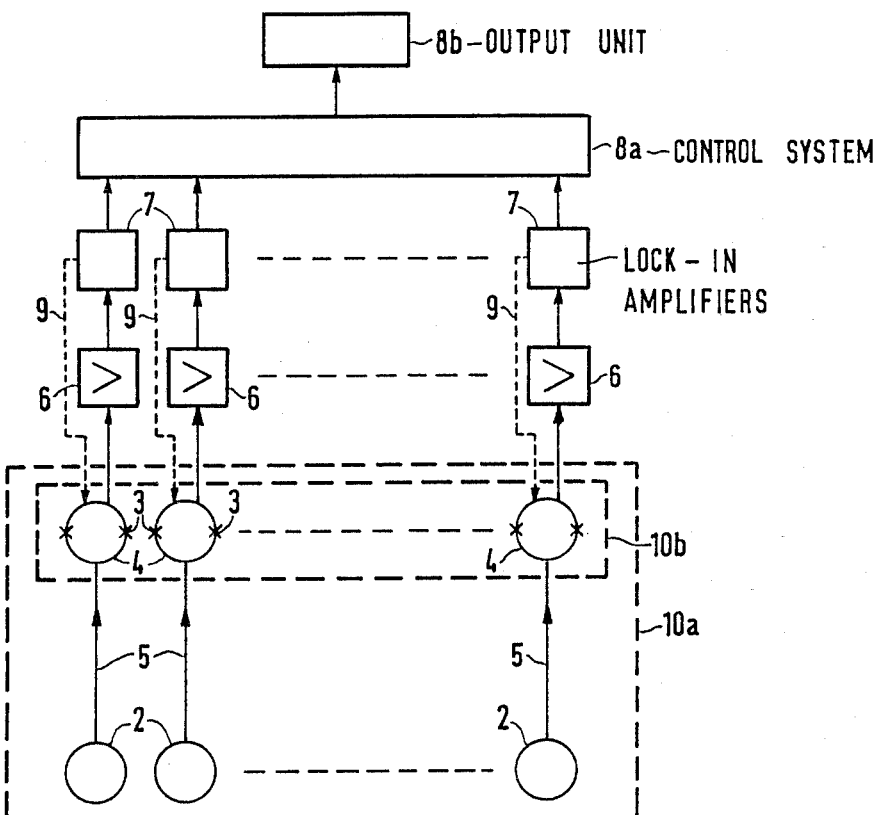
FIG. 1 shows diagrammatically a preferred embodiment of the measurement device of the invention.

Referring to FIG. 1, a predetermined number N of parallel measuring channels has been provided for the measurement device. In this case, each channel contains a superconducting gradiometer 2, a DC SQUID 4 equipped with two Josephson contacts 3, a superconducting connecting element 5 to connect the gradiomeer with SQUID 4, preamplifier 6 that might, for example be cooled to the same level and a lock-in amplifier 7. The N unprocessed signals received from lock-in amplifiers 7 are then conducted to a common electronic data-processing and control system 8a, for further processing, and to output unit 8b for presentation. Feedback in the channels to the respective SQUIDs with the signals received from lock-in amplifiers 7 is indicated by dotted lines 9. The directions for the signal transmission are shown in the FIG. 1 by means of arrows along the corresponding lines.

As shown in FIG. 1, by means of broken lines, gradiometers 2, SQUIDs 4 and elements 5, that connect the gradiometers and the SQUIDs are arranged on common substrate structure 10a. In a similar manner, SQUIDs 4, with their associated thin-film transformers, are located on carrier chip 10b which is rigidly mounted on substrate 10a.

It is well known that for a specified distance between a gradiometer coil 2 and the magnetic field source to be detected by it, for example, in the heart, specific optimum dimensions exist for the gradiometer coils with regard to their sensitivity ("Journal of Magnetism and Magnetic Materials", Volume 22, 1981, No. 2, Pages 129 to 201). For field sources located at various distances, however, a change in the dimensions of the individual gradiometer coils is impossible from a practical point of view. Therefore, to be able to make an adjustment for the distance to the field source to be detected in each case, the signals generated at the individual gradiometer coils 2 of the measurement device can be advantageously combined. Accordingly, for example, in the case of the embodiment shown in FIG. 1, it is possible to combine the signals from any two or three of the gradiometer coils. The combination of the signals in this case should preferably occur in the area of electronic system 8a, which is common to all the coils, by means of appropriate connecting circuits.

In addition, it is advantageous to adjust the dimensions of each gradiometer coil (in the case of circular coils the diameter is adjusted) in relation to the distance of the closest magnetic field source to be detected. This adjustment is to obtain optimal local resolution. Thus, for example, for magnetoencephalographic a diameter of about 2 cm which is optimum for the movement of sources in the cerebral cortex. In order to permit an adjustment for magnetic field sources that lie deeper within the body, coil relationships are then set up by means of the above mentioned combination of signals from individual gradiometer coils, which substantially correspond to effective coil dimensions that are optimal for these greater distances between the magnetic field source and the coil.

Details of the arrangement of the gradiometers and SQUIDs on appropriate substrates are shown schematically in the other figures. The simplest arrangement of field sensors is an array of gradiometers of zero order, which is a level arrangement of adjacent flat cylindrical coils made of superconducting wire. Measurements made with an array of this type without additional compensation of external fields requires a relatively costly screening facility. However, this type of gradiometer array can be easily manufactured.

Figure 2:
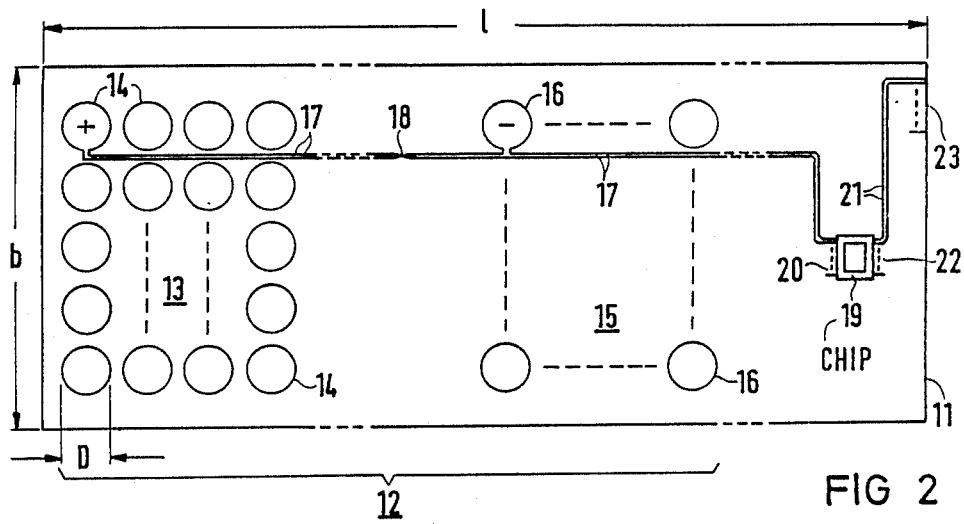
FIG. 2 is a diagram of a substrate for this device, which shows the location of the SQUIDs and gradiometers.
Figure 5:
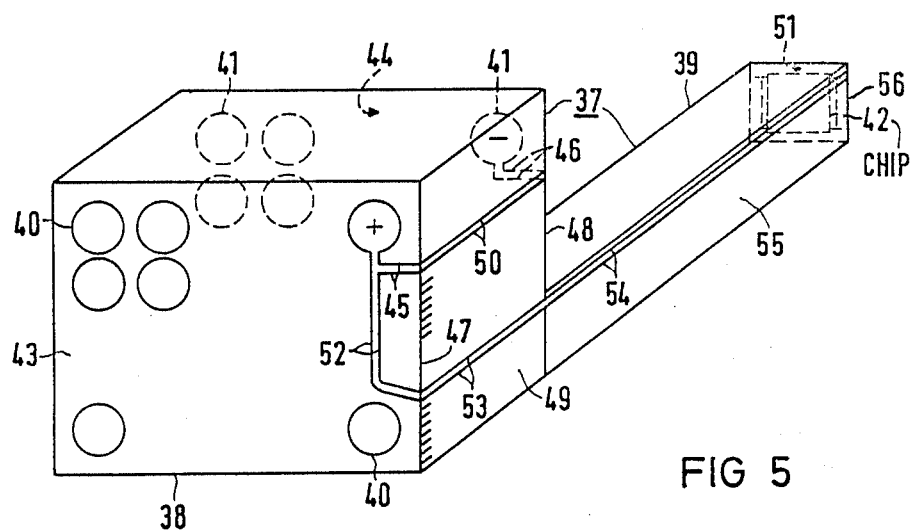
FIG. 5 shows diagrammatically an alternate design for a device in accordance with the invention.

The gradiometers shown in FIGS. 2 and 5, have lesser requirements with regard to screening. While the gradiometer array shown in FIG. 2 is planar in design, FIG. 5 illustrates a gradiometer array arranged on two levels.

In FIG. 2 a planar series of gradiometers, also known as a gradiometer array, is deposited on planar substrate 11, which is for example, a quartz or silicon plate about 10 mm thick, 12 cm wide (b) and 20 cm long (1). This gradiometer array, which is designated 12, consists of an array 13 of detecting coils 14, an array 15 with a corresponding number of compensation coils 16, and appropriate leads 17. The figure shows only a few of the flat coils and leads. Each of arrays 13 and 15 consists, for example, of 4×5 individual superconducting flat coils with one winding each. The winding diameter D is roughly equivalent to the distance from the object to be investigated and therefore, might for example be a few centimeters. Since, as shown in the figure by a "+" and "−" sign, the direction of the windings of detection coils 14 is opposite to the direction of the windings of compensation coils 16, a crossover point 18 must be formed in each case, between the two arrays of flat coils, in leads 17.

It is possible to arrange detecting coils 14 and compensation coils 16 in a different arrangement than shown in FIG. 2. Thus, for example, if there is external compensation, the detecting coils can be enclosed by a ring formed by the individual compensation coils.

Array 15 of flat compensation coils can also be advantageously replaced by a smaller array of coils with a correspondingly increased number of windings. This can be accomplished, for example, by a lithographic process with the aid of an intermediate insulating layer.

Also located on substrate 11 is chip 19 which has a number of DC SQUIDs corresponding to the number of gradiometers, and including superconducting coupling transformers and modulation coils with terminals. In general, silicon is chosen for the chip material. The coupling transformers can be constructed in a conventional manner as flat coils (cf. "IEEE Trans. Magn.", Vol. MAG-17, No. 1, January 1981. Pages 400 to 403). At terminal points 20, respective leads 17 which are used to conduct the field signals registered in the gradiometer coils, are connected by superconducting leads to these coupling transformers.

Figure 3:
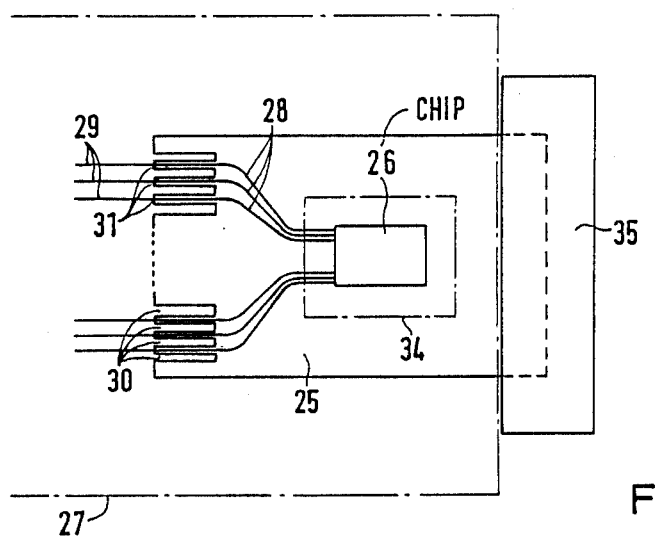
FIGS. 3 and 4 show a top view and cross-sectional view, respectively, of a carrier for a corresponding SQUID chip.

The signals picked up at the individual SQUIDs are then conducted over non-superconducting input/output lines 21 to multiple connector 23. Input/output lines 21 are connected to appropriate terminal points 22 on DC SQUID chip 19. The amplifiers of the respective channels are in turn connected to multiple connector 23. It is advantageous to use a material for substrate 11 and chip 19 which minimizes variations in thermal expansion. It is lso advantageous to use a soldering technique for the various connections. When such a chip carrier is used, it is also possible to exchange chips easily. An example of an embodiment of an appropriate chip carrier can be seen in the top view and lengthwise cross-section shown respectively in FIGS. 3 and 4. The chip carrier (designated as 25 in FIGS. 3 and 4) can be advantageously made of the same material as chip 26 that is mounted on it and which carries the SQUIDs and their thin-film transformers. Therefore, for example, the chip carrier can be made of silicon and plate 27, which carries the gradiometers, can be made of quartz. In order to relieve thermal stress at the terminals between strip conductors 28 which are deposited on the chip carrier, and strip conductors 29, which lead to the gradiometer coils and are located on carrying plate 27, chip carrier 25 has a series of deep notches 30 between the terminals. A resulting comb-like structure is produced on the terminal side, with teeth 31 formed between notches 30. Strip conductors 28 and 29 are connected with one another by means of solderings 32 on the free ends of teeth 31.

Figure 4:
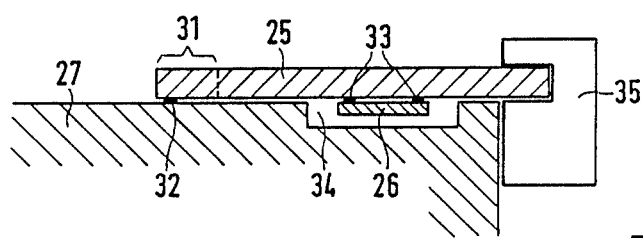

As can be seen from the lengthwise cross-section in FIG. 4, chip 26 is fastened to the underside 34 of the chip carrier 25 by solderings 33 of the strip conductors. An appropriate recess has therefore been provided in quartz plate 27. In addition, chip carrier 25, on its side facing away from the gradiometer coils, can project a bit beyond carrying board 27. This makes it possible to have on this side of carrier 25 a plug 35, to connect the SQUIDs to the appropriate amplifiers, which connects directly to the corresponding normally conducting strip conductors.

A measurement device having a carrier plate and manufactured in accordance with the invention is explained now with regard to FIG. 2. The first step in manufacturing this device is to construct, on carrying plate 11, planar gradiometer series 12 with detecting coils 14 and compensation coils 16 in the form of superconducting thin-film coil arrays. These arrays are made, for example, from lead, using a conventional planar lithographic process. During this initial step, it is also possible to manufacture leads 17, which connect the individual coils with one another, and crossover points 18, as a thin-film structure.

Independently of the above, the DC SQUID array may also be manufactured from niobium. In subsequent steps, the superconducting coupling transformers and modulation coils are deposited, in the form of a multilayer thin-film structure, on silicon chip 19. Integrated circuit technology is used for this deposition. The coil terminals are made, for example, of lead. The DC SQUID chip is then firmly attached to carrying plate 11 on which the gradiometer array is located, in particular, with a conventional soldering process ("J. Electrochem. So.: Solid-State Science and Technology", April 1982, Pages 859 to 864). Soldering has the advantage that virtually no three-dimensional conductor strips are created. This is advantageous because three-dimensional conductor strips make it more difficult to adjust the gradiometers. Finally, gradiometers array 12 is connected with the DC SQUIDs located on chip 19. For this purpose soldered connections based on superconducting lead alloys my, for example, be used.

A single adjustment is then made for this arrangement of gradiometer array 12 and the DC SQUIDs on chip 19 that are associated with them on the carrying board 11. A laser beam is particularly well suited for this purpose; it is used to reduce the width of the individual coil windings.

When the gradiometer is designed as a thin-film structure on several planes with thin-film leads on a surface that is orthogonal, the adjustment can be easily made on this orthogonal surface. It is desirable to make the adjustment after test measurements in homogenous magnetic fields and homogenous gradient fields. It is advantageous to use planar gradiometers on several plane rather than planar constructed gradiometers because axially constructed gradiometers have better directional characteristic than planar gradiometers. An embodiment of an appropriate gradiometer structure of the first order can be seen in FIG. 5. In this figure some of the parts masked by the carrying substrate are indicated by broken lines. Carrying substrate 37 consists of parts 38 and 39 which are in the shape of right parallelepipeds rigidly attached to one another. The substrate holds gradiometer coils 40 and 41 or DC SQUID chip 42. The figure only shows a few of the gradiometer coils with their corresponding connecting leads. On front face 43 of part 38 of the substrate, which can be a quartz prism, detecting coils 40 are deposited. The detection coils can correspond to coils 14 in FIG. 2. The rear face 44 of this quartz prism carries compensation coil 41 corresponding to coils 16 in FIG. 2. Each detecting coil 40 is connected with its associatred compensation coil 41 on the opposite face, over the edges of the prism. This is accomplished by strip conductors 45 and 46, which are a few microns apart on faces 43 and 44 respectively. These conductors lead to edges 47 and 48 respectively of face 49 of quartz prism 38, which is orthogonal to faces 43 and 44. Additionally, strip conductors 50 extend over orthogonal face 49 between edges 47 and 48. Part 39 of the substrate, which is in the shape of a column and can also be made of a quartz prism, is rigidly attached to rear face 44 of part 38. This column-shaped prism has a cross-section adjusted to the size of DC SQUID chip 42. This chip may then be mounted, for example, on side 51 of column-shaped part 39 that is turned away from face 44. The DC SQUIDs of chip 42 are connected with the gradiometer coils via strip conductors 52 which correspond to strip conductors 45. These strip conductors run from individual detection coils 40 to edge 47 to face 43. At this edge conductors 52 are connected to strip conductors 53, which extend over orthogonal face 49 to edge 48 and correspond to strip conductors 50. By means of appropriate strip conductors 54, which are introduced on side face 55 of part 39, which lies in the same plane are orthogonal face 49, a connection is made between edge 48 and edge 45 and side 41 of prism 39 which carries chip 42. In addition to the arrangement of chip 42 on side 51, shown in FIG. 5, chip 42 can also be fastened to side face 55. In this case, strip conductor connections to edge 56 can be eliminated.

The arrangement of detection coils 40 and compensation coils 41 on two parallel levels of a substrate, as shown, for example, in FIG. 5, means that orthogonal levels are available. These levels can advantageously be used for introducing additional detection strips, for example, in thin-film technology, at these levels, with which the three vector components of the magnetic field can be determined for purposes of adaptive filtering (cf. "Rev. Sci. Instrum.", Vol. 53, No. 12, 1982, Pages 1815 to 1845, in particular Page 1836).

To reduce the expense of the lithography for the manufacture of the gradiometer, superconducting connections made of copper wire with Pb-In sheathing can be used when less mechanical stability is required. In this case fine soldering is possible at reinforced contacts.

Figure 6:
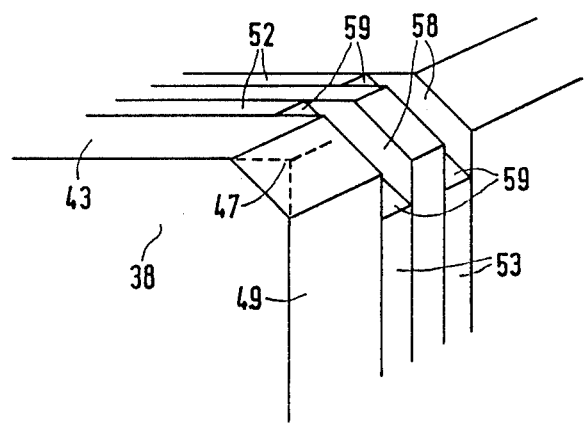
FIGS. 6 and 7 are detailed partial diagrammatic views of the measurement device, showing a connection on its strip connectors.

The connection of strip conductors 52 with strip conductors 53 at edge 47 is accomplished advantageously according to a method shown in FIG. 6 for two strip conductor connections. Here, parts that are the same as in FIG. 5 are marked with the same reference number. Accordingly, at each predetermined connection point a groove 58 is cut perpendicularly into edge 47 between faces 43 and 49, before a thin film of the material of which the strip conductores are made is applied to the faces, including the walls of the groove. Next, conventional lithographing techniques are used to form the strip conductors by removing the superfluous portions of the applied films. In addition, edge 47 is slightly beveled to obtain sharper delimitations between coated and non-coated portions there. To improve the connection between strip conductors 52 and 53, it is possible, in addition, to solder to the bottom of the groove between the respective transition points to the parts deposited in grooves 58. In the Fig. solder joints of this kind are designated by 59. Superconducting lead-indium solder is particularly useful for this purpose.

It is also possible to manufacture the connections between strip conductors 50 and strip conductors 45 and 46, as well as the connections to edge 56.

Figure 7:
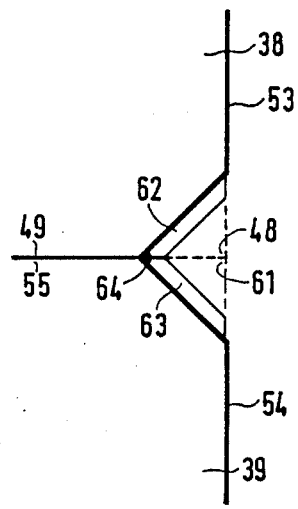

FIG. 7 is a diagrammatic view of the transition of the strip conductors from part 38, which carries gradiometer coils 40 and 41, to part 39 which carries DC SQUID chip 42. The view shows a section through the corresponding portion of the embodiment shown in FIG. 5. In order to connect strip conductors 53 with strip conductors 54, they are first provided with connecting elements in grooves 62 and 63 respectively at respective edges 48 and 61, according to the process indicated in FIG. 6. Next sides 49 and 55 of parts 38 and 39 are placed together in such a way that the conducting portions in grooves 62 and 63 come in contact with one another. Then, one more soldering 64 is made, with, for example, a lead alloy, before which the film coatings in the grooves are strengthened by electroplating techniques.

In the embodiments of measurement devices shown in the figures, no effort has been made to portray any methods for screening the DC SQUIDs against magnetic interference fields, for reasons of clarity, and because appropriate methods are generally known. Thus, for example, in order to screen a SQUID chip, the SQUIDs on the chip can be surrounded individually by closed superconducting ring structures. It is also possible to coat the backside of the chip with superconducting material. If a special chip carrier is used, it, too, can be provided with an appropriate coating on its back. In this case the chip and its carrier can also be surrounded with a superconducting sheath that is closed up to an opening at the feed lines.

If gradiometers of the second order are to be constructed, then it is advantageous to put two individually adjusted units corresponding to part 38, shown in FIG. 5, together, and to connect their lines with one another over the edges in accordance with the process described with the aid of FIGS. 6 and 7.

Thus, for the construction of the substrate for the measurement device, the following 3 possibilities exist:

(a) A common carrying body is provided, on which the thin-film magnetometer arrays and the thin-film leads for a complete gradiometer of the 1st or 2nd order, including a SQUID chip on a chip carrier, are deposited.

(b) Two complete gradiometers of the 1st order are constructed according to the option described above under (a). Then they are put together in a mechanically rigid structure, in order to construct a gradiometer of the 2nd order out of two parts, which are also named as modules.

(c) Two rigid thin-film magnetometer arrays and a SQUID chip on a chip carrier are put together in a mechanically rigid structure and connected with one another by means of superconducting screened bundles of wire.

In the embodiments of the gradiometer coils that are shown in the figures, a circular design for the individual windings has been assumed. If necessary, however, to optimize the utilization of the surface and to minimize the mutual coupling, some design other than a circular one can be used.

There has thus been shown and described a novel device and method for the multi-channel measurement of weak variable magnetic fields and method for manufacturing said device which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

I claim:

1. In a multi-channel device for the multi-channel measurement of weak variable magnetic fields with field strenghts below $10^{-10}$T wherein each channel includes a superconducting quantum interference device (SQUID), a gradiometer of predetermined order having superconducting coils and superconducting connecting elements from the quantum interference device to the gradiometer, said superconducting connecting elements include an associated coupling transformer and connecting leads, and the multi-channel device includes electronic equipment connected to the superconducting quantum interference devices for the evaluation, processing and presentation of information obtained at the quantum interference devices, the improvement comprising a common rigid substrate having mounted thereon all of said direct current superconducting quantum interference devices, planar-designed gradiometer coils comprising an array of detection coils and an array of compensation coils, at least one of said detection coils and at least one of said compensation coils being assoiacted with a respective one of said quantum interference devices and said superconducting connecting elements, wherein said gradiometer coils and said superconducting connecting elements are arranged as thin-film structures on one or more levels of said common rigid substrate.

2. The measurement device of claim 1, wherein said direct-current superconducting quantum interference devices are deposited on a common carrier chip and said common carrier chip is securely fastened to said rigid substrate.

3. The measurement device of claim 2, wherein said gradiometer coils are of the 1st or a higher order, wherein said rigid substrate includes a single carrying part for said gradiometer coils, said connecting elements and said carrier chip of the direct-current superconducting quantum interference devices.

4. The measurement device of claim 1, wherein all of said gradiometer coils are deposited on a common face of said rigid substrate next to one another.

5. The measurement device of claim 1, wherein said rigid substrate is composed of a plurality of parts.

6. The measurement device of claim 5, wherein said gradiometer coils are of the second order, wherein said rigid substrate includes two carrying parts, each of said parts being equipped with a gradiometer of the first order.

7. The measurement device of claim 5, wherein said rigid substrate comprises quartz or silicon parts.

8. The measurement device of claim 1, wherein said detection coils have a different number of windings and different surface areas as compared with said associated compensation coils.

9. The measurement device of claim 1, wherein said detection coils and said compensation coils are arranged on different parallel faces of said rigid substrate.

10. The measurement device of claim 9, wherein said direct-current superconducting quantum interference devices are deposited on a face of said rigid substrate, said face being in a plane other than that of said faces on which said gradiometer coils are deposited.

11. The measurement device of claim 9, wherein said connections between said gradiometer coils are located on said parallel faces, and are formed by thin-film conductors running between edges of said faces.

12. The measurement device of claim 9, wherein said connections between said gradiometer coils and said direct-current superconducting quantum interference devices are formed by thin-film conductors running between said edges of said faces carrying these parts.

13. The measurement device of claim 12, wherein said connection of said superconducting conductor elements to said edges is formed by soldering joints with superconducting material in grooves.

14. The measurement device of claim 13, wherein said edges that include said grooves are beveled.

15. The measurement device of claim 2, wherein said carrying chip is fastened indirectly to said rigid substrate by means of an intermediate carrier.

16. The measurement device of claim 15, wherein said intermediate carrier has slits in the area of said superconducting conductor terminals.

* * * * *